United States Patent [19]

Voegele et al.

[11] Patent Number: 5,481,200
[45] Date of Patent: Jan. 2, 1996

[54] FIELD TRANSMITTER BUILT-IN TEST EQUIPMENT

[75] Inventors: Kevin D. Voegele, Shakopee; Jane B. Lanctot, Minneapolis; Brian L. Westfield, Victoria, all of Minn.

[73] Assignee: Rosemont Inc., Eden Prairie, Minn.

[21] Appl. No.: 121,064

[22] Filed: Sep. 15, 1993

[51] Int. Cl.[6] .................................................. G01R 27/08
[52] U.S. Cl. ....................... 324/718; 324/713; 324/771
[58] Field of Search ................................ 324/691, 704, 324/713, 715, 718, 771

[56] References Cited

U.S. PATENT DOCUMENTS

| | | | |
|---|---|---|---|
| 3,959,772 | 5/1976 | Wakasa et al. | 340/167 A |
| 4,020,416 | 4/1977 | Ottos | 324/703 |
| 4,086,570 | 4/1978 | Wakasa et al. | 340/172 |
| 4,403,297 | 9/1983 | Tivy | 364/579 |
| 5,223,798 | 6/1993 | McGinnis et al. | 324/713 |
| 5,339,025 | 8/1994 | Jones et al. | 324/713 X |
| 5,382,912 | 1/1995 | Blain | 324/713 |
| 5,386,188 | 1/1995 | Minneman et al. | 324/704 X |

FOREIGN PATENT DOCUMENTS

| | | |
|---|---|---|
| 55-23638 | 2/1980 | Japan. |
| 2224853 | 5/1990 | United Kingdom. |
| 2260416 | 4/1993 | United Kingdom. |

Primary Examiner—Kenneth A. Wieder
Assistant Examiner—Glenn W. Brown
Attorney, Agent, or Firm—Westman, Champlin & Kelly

[57] ABSTRACT

An improved error detection for microprocessor-based transmitters in two-wire process control loops operating in the process control industry. In particular, techniques are shown which are useful in solving malfunctions or failures of microprocessor-based transmitters. When the transmitter is energized, the impedance of the process loop cabling is resolved and stored, displayed or transmitted as desired. The loop impedance is used to calculate potential of a power supply used to power the control loop. This information is used in testing the two-wire loop.

8 Claims, 1 Drawing Sheet

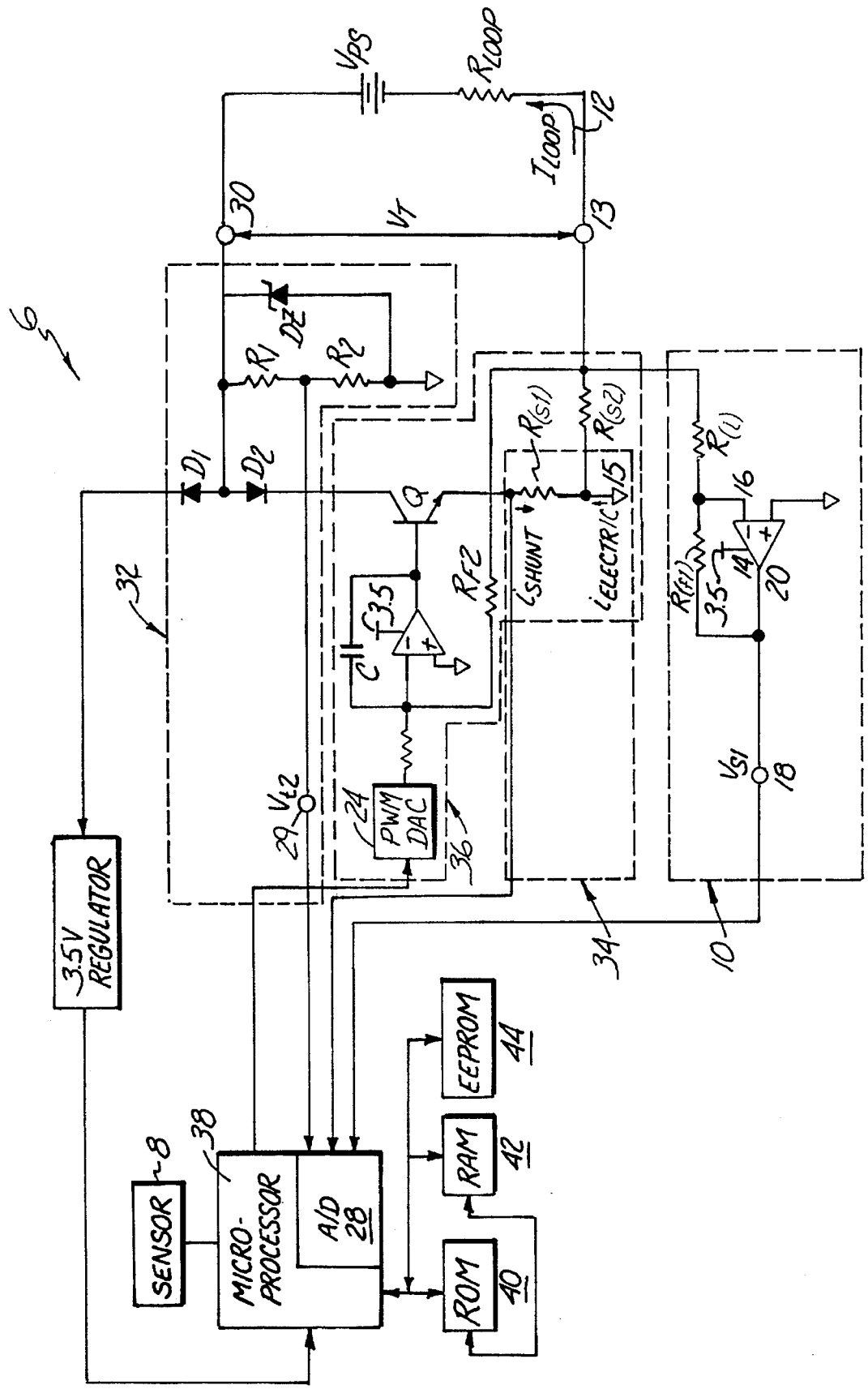

FIELD TRANSMITTER BUILT-IN TEST EQUIPMENT

BACKGROUND OF THE INVENTION

The present invention relates to process control transmitters operating in the process control industry. In particular, the invention relates to transmitter built-in test equipment useful in solving malfunctions or failures of microprocessor-based process control transmitters.

Efficient manipulation of a process variable in a controlled process requires that faults in a transmitter or its related transducer or communication circuits be identified immediately so that appropriate corrective action or appropriate warnings may be implemented. Verification of a malfunction or error prior to stopping the process and removing a transmitter from a process loop provides inherent efficiency. Present microprocessor-based transmitters contain complex electrical circuits that sometimes appear to have failed, while actually only a leakage or shunted electrical current has occurred. For example, a circuit leakage current that affects loop current may be reported as a transmitter fault.

SUMMARY OF THE INVENTION

The present invention includes various transmitter diagnostic measurement techniques useful in troubleshooting transmitters installed in a process control loop. The techniques of the present invention periodically calculates the process loop cabling resistance, transmitter terminal voltage, process loop power supply voltage, transmitter electronics current draw and process loop electrical current.

The invention includes a microprocessor coupled to the loop with analog-to-digital converters. The A/D converters measure loop current, leakage current and terminal voltage. The microprocessor controls loop current through a digital-to-analog converter, and calculates loop resistance and power supply potentials.

BRIEF DESCRIPTION OF THE DRAWINGS

The sole FIGURE is an electrical schematic drawing of an electronics and loop current measurement circuit of the present invention.

DESCRIPTION OF THE PREFERRED EMBODIMENTS

The present invention is a transmitter in a two-wire process control loop including electronics to measure resistance of the current loop and voltage of the power supply used to power the loop. The electrical current flowing in a process loop will exceed a desired process loop current value when a transmitter electronics current has a high leakage or shunt current such as when moisture or some other electrical conductor contacts the electrical supply rail for an internal transmitter electronics circuit.

The Figure shows transmitter 6 for transmitting a signal from a sensor 8 over a two-wire current loop. The sole Figure shows an electrical circuit diagram depicting a circuit 34 for measuring a shunt current within the transmitter, as well as a circuit 10 for measuring an electrical current flowing in the process loop. The current draw of electronics in the transmitter can be derived by subtracting the shunt current value from the electrical current actually flowing in the process loop.

The electrical current present in a process loop, denoted by arrow 12, flows through the process loop cable which inherently has resistance which varies linearly with the length of the cable. The electrical resistance, denoted as R(loop), inhibits the electrical current flowing through the cable, so that when the electrical current consequently flows through a loop current control sense resistor R(s2) it causes a negative electrical potential to appear on a transmitter terminal 13 with respect to a reference voltage or ground potential 15. This negative electrical potential at terminal 13 is amplified and inverted by an operational amplifier 14 coupled to terminal 13 and a first end of sense resistor R(s2). Operational amplifier 14 has a first end of two high impedance resistors R(f1) and R(i) coupled to the inverting terminal 16 of amplifier 14 to produce an electrical potential V(s1), representative of electrical current present in the process loop, at a node 18 where a second end of the high impedance feedback resistor R(f1) electrically couples to the output terminal 20 of amplifier 14. The electrical potential V(s1) at node 18 is related to electrical current actually flowing through the process loop of interest and as determined by the following equation:

$$V(s1) = [(I(\text{loop}) * R(s2)) * (-1) * (R(f1)/R(i))] \quad (1)$$

V(s1) is measured with analog-to-digital converter (ADC) 28, coupled to microprocessor 38 and EEPROM 44, and is proportional to the actual loop current 12. This is because the circuit 10 is characterized over a broad temperature range so that proper corrections to restore linearity to the transmitter output signal may be made. During the characterization process at the factory, all loop current control circuits are run during temperature cycles, covering the anticipated complete operating range of the transmitter. Correction coefficients generated from these cycles are stored in the output electronics memory and used for signal correction during operation. This compensation data is stored in nonvolatile EEPROM memory 44. This data is retained in the EEPROM 44 of the transmitter so if electrical power to the transmitter is interrupted the transmitter is functional upon power-up. This compensation data is used to correct and linearize the 4–20 mA output signal.

Referring again to the Figure, an electrical circuit schematic useable for measuring terminal voltage is shown generally at 32. Once the terminal voltage and loop current values are resolved, the actual loop resistance and the power supply voltage can be resolved by use of an algorithm, as hereunder disclosed.

Analog-to-digital converter 28 converts the analog output signal V(t2) at node 29, which is representative of a process variable, to digital form. The transmitter analog output signal at node 30 is an electrical potential proportional to the terminal voltage V(t) as given in the following equation:

$$V(t2) = [V(t) - I(\text{loop}) * R(s2)] * [R2/(R1+R2)] \quad (2)$$

Thus, once V(t2) is known, the equation can be solved for V(t) since the loop current R(s2), R1 and R2 are all known values.

To solve for the loop resistor value R(loop) the loop current is set by the microprocessor 38 to a first known milliamp value i(ll). The output electrical potential signal V(t2) is converted by the ADC 28 and the terminal voltage V(t1) is solved by the microprocessor 38. Then the loop current is changed by the microprocessor to a second known value i(lh) higher than the first value, and v(t2) is converted by the ADC and the terminal voltage V(th) solved and displayed if below a preselected value below which malfunctions can occur if the transmitter attempts operations requiring further electrical energy. Thus, with a known fixed power supply signal V(ps), and the voltage drop V(Rs2) across resistor Rs2, the value of the process loop cabling resistance R(loop) can be solved with the following equation:

$$R(\text{loop}) = [(V(tl) - V(th))/(i(lh) - i(ll))] - R(s2) \quad (3)$$

It should be noted that this calculation occurs when the transmitter is initially electrically energized, since this technique requires differing test currents to be passed through the process loop. Although for process loops having very slow periods, an operator skilled in the art could implement this technique with adequate results.

The power supply voltage V(ps) can now be solved based on the known value of the process loop resistance R(loop), which is assumed constant, and one of the loop current test conditions, for example i(lh) as follows:

$$V(ps) = V(t) + V(d1) + V(d2) + i(lh)(R(\text{loop}) + R(Rs2)) \quad (4)$$

The resistance values of diodes, D1 and D2, can be assumed to be constant values or can be ignored entirely because the criteria voltage V(c) for adequate energy for logging data can be implemented without them. They can be ignored if we assume that the voltage drop due to the diodes is not much different over the operating current draw required by the transmitter.

Using the same electrical circuit as above, the present invention can be adapted to indicate whether the process control transmitter can safely enter process data to an electronic data logger. Accordingly, adequate power supply voltage must be available to provide the electrical energy required by known nonvolatile, reprogrammable memory devices. Some nonvolatile reprogrammable memory devices consume additional amount of electrical current during a write to the data logging equipment. It is possible that such additional amount of electrical current will draw enough current to collapse the voltage rail, or electrical power supply, which is 3.5 VDC in the present case. If the rail collapses, the data to be logged is lost. Adequate power supply voltage will prevent the 3.5 volt rail from collapsing. To prevent this from happening, the present invention provides a measure of transmitter terminal voltage with a known amount of electrical resistance inserted in series with the loop circuit when a known loop electrical current is conducted therethrough. Thus, a determination is made of whether peak current will still leave adequate terminal voltage for data logging. Data logging is a process of writing information to a non-volatile memory and requires substantial energy.

The possible values of the respective voltages can be broken into three alternate forms of action: (1) if V(ps) is within V(c)+0.5 volts a warning of low power supply voltage is triggered by setting a software flag in the HART® protocol; (2) if V(ps)=V(c) logging may not be possible at the peak current required for logging and appropriate warning flags are set; (3) analysis of the two above equations prior to an attempted logging event will provide information regarding the ability to successfully complete the log. It should be noted that once V(c)=V(ps) for logging at peak current, a data log into an EEPROM or other local memory device should first occur so that the data is saved in the event that the rail voltage collapses as a result of the attempted data log.

The measure of power supply voltage is a very useful diagnostic method especially for battery-powered process control transmitters. Warnings of low supply voltage provides a preventative maintenance diagnostic useful to the end user, it may be displayed locally or transmitted remotely via the industry standard HART® protocol. Thus, the calculated loop resistance and power supply potential values can be transmitted over the loop by modulating current through the loop with circuit 36.

Furthermore, the measurement of loop resistance will provide a means of tracking an increase in apparent loop resistance so that a leakage path or shunt current from a twisted wire pair to ground can be detected, or the field wiring cable length can be determined without stopping the process and inspecting the transmitters in the loop, it may be displayed locally or transmitted remotely via the industry standard HART® communications protocol.

In the present invention, loop current is "characterized" over a broad range of temperatures with a digital-to-analog converter (DAC), which allows accurate control of the loop current under normal operating conditions. The DAC provides a preset electrical current and the loop current is the sum of an electronics current and any shunt currents. The circuit of the present invention always supplies the preselected electrical current requested by the DAC, provided the electronics current to the transmitter electronics does not exceed the desired loop current, since the shunt current cannot be negative.

On an industry standard 4–20 mA transmitter, the full scale of measurement of a calibrated transmitter requires the full 16 mA range to register and communicate measurements at the low end of the scale. As is known, if a fault occurs in the electronics causing the electronics to draw 6 mA, the loop current can only be as low as 6 mA. Thus, while the transmitter will operate reasonably well with a range of 6–20 mA, the transmitter will not be able to communicate to remote controllers or other process control instrumentation with a loop current of 6 mA for certain industry standard communication protocols. For example, the open communication protocol known as the Highway Addressable Remote Transducer protocol or HART®, will not operate at 6 mA, since the HART® protocol requires electrical shunt current modulation of ±0.5 mA for communications and operations. The operator of the process may not know of the problem and may receive inaccurate data if the transmitter needs to send anything less than a 6 mA process control signal. Accordingly, the circuit of the present invention displays a message locally, and can annunciate an appropriate signal representative of an error condition when the electronics current exceeds a preset value or when the transmitter terminal voltage falls below a preset value. In conjunction with this circuit a second part of the present invention teaches a circuit for measuring terminal voltage. Adequate terminal voltage is needed to determine if data logging or other electrical energy-consuming operations are possible. It has been found that once the terminal voltage and the loop current are known, the actual loop resistance and power supply voltage can be solved. Suitable alarm or status signals may then be routed so that the operator of the process control transmitter can take corrective action as necessary.

Although the present invention has been described with reference to preferred embodiments, workers skilled in the art will recognize that changes may be made in form and detail without departing from the spirit and scope of the invention.

What is claimed is:

1. A measurement transmitter coupling to a two-wire process control loop, comprising:

two terminals for coupling to the two-wire process control loop;

a sensor for sensing a process variable;

circuitry for transmitting the process variable over the two-wire loop;

current setting circuitry for setting a current through the two-wire loop to a first current level and to a second current level;

voltage sense circuitry providing a sensed voltage output related to a sensed voltage potential between the two terminals; and a microprocessor coupled to the voltage sense circuitry and the current setting circuitry for calculating loop resistance of the two-wire current loop based upon a difference between the first and second current levels and a first voltage potential sensed at the first current level and a second voltage potential sensed at the second current level.

2. The measurement transmitter of claim 1 wherein the microprocessor includes means for calculating a potential across a loop power supply based upon the loop resistance and one of the current levels.

3. The measurement transmitter of claim 2 wherein the microprocessor provides a warning output if the potential across the loop power supply is less than a predetermined lower limit.

4. The measurement transmitter of claim 2 wherein the microprocessor determines the potential across the power supply prior to logging data, and inhibits data logging if the potential is less than a predetermined lower limit.

5. The measurement transmitter of claim 1 wherein the microprocessor controls the current setting circuitry.

6. The measurement transmitter of claim 1 wherein the circuitry for transmitting receives the loop resistance from the microprocessor and transmits the loop resistance over the two-wire loop.

7. The measurement transmitter of claim 6 wherein the loop resistance is transmitted in a digital format.

8. The measurement transmitter of claim 1 wherein the microprocessor monitors current in the process control loop prior to logging data, and inhibits data logging if current is less than a predetermined lower limit.

* * * * *